(12) United States Patent
Schapendonk et al.

(10) Patent No.: US 9,939,496 B2
(45) Date of Patent: Apr. 10, 2018

(54) SENSOR SYSTEM WITH A FULL BRIDGE CONFIGURATION OF FOUR RESISTIVE SENSING ELEMENTS

(71) Applicant: NXP B.V., Eindhoven (NL)

(72) Inventors: Edwin Schapendonk, Oss (NL); Pieter Van Der Zee, Oosterbeek (NL); Fabio Sebastiano, Rotterdam (NL); Robert Van Veldhoven, Eindhoven (NL)

(73) Assignee: NXP B.V., Eindhoven (NL)

( * ) Notice: Subject to any disclaimer, the term of this patent is extended or adjusted under 35 U.S.C. 154(b) by 310 days.

(21) Appl. No.: 14/716,595

(22) Filed: May 19, 2015

(65) Prior Publication Data
US 2016/0341800 A1 Nov. 24, 2016

(30) Foreign Application Priority Data

Jun. 13, 2014 (EP) .................................. 14172427

(51) Int. Cl.
*G01R 33/02* (2006.01)
*G01R 33/00* (2006.01)
(Continued)

(52) U.S. Cl.
CPC ........... *G01R 33/0023* (2013.01); *G01D 5/16* (2013.01); *G01R 33/09* (2013.01); *G01D 5/145* (2013.01)

(58) Field of Classification Search
CPC ...... G01R 17/00; G01R 17/10; G01R 17/105; G01R 17/12; G01R 33/0023; G01R 33/02;
(Continued)

(56) References Cited

U.S. PATENT DOCUMENTS 3,214,751 A * 10/1965 Johnson .................... G01D 5/38
341/13
5,430,374 A * 7/1995 Metz ....................... G01D 5/145
324/207.21
(Continued)

FOREIGN PATENT DOCUMENTS

CN 101523728 A 9/2009
CN 103792981 A 5/2014
(Continued)

OTHER PUBLICATIONS

Hui et al., MEMS magentic field sensor based on silicon bridge structure, Journal of Semiconductors, vol. 31, No. 10, Oct. 2010.*
(Continued)

*Primary Examiner* — Jermele M Hollington
*Assistant Examiner* — Sean Curtis
(74) *Attorney, Agent, or Firm* — Rajeev Madnawat

(57) ABSTRACT

A sensor system is disclosed. The sensor system includes a first sensor path comprising a first sensing element and a second sensing element being connected in series between a first supply terminal and a second supply terminal and an intermediate node connected in between the first supply terminal and the second supply terminal, a second sensor path comprising a third sensing element and a fourth sensing element connected in series between the first supply terminal and the second supply terminal, a first reference node connected in between the first supply terminal and the second supply terminal, and a second reference node connected in between the first supply terminal and the second supply terminal, and a processing unit to receive an input signal from the intermediate node, a first reference signal from the first reference node, and a second reference signal from the second reference node.

14 Claims, 2 Drawing Sheets

(51) Int. Cl.
  *G01R 33/09* (2006.01)
  *G01D 5/16* (2006.01)
  *G01D 5/14* (2006.01)

(58) Field of Classification Search
  CPC .... G01R 33/0005; G01R 33/09; G01R 15/14;
  G01R 15/148; G01R 15/20; G01R
  27/2629; G01R 27/2694
  USPC ....... 324/98, 207.19, 207.21, 244, 252, 526,
  324/510
  See application file for complete search history.

(56) References Cited

U.S. PATENT DOCUMENTS

| | | | | |
|---|---|---|---|---|
| 6,246,233 B1* | 6/2001 | Griffen | ................ | G01D 5/145 324/207.12 |
| 6,326,781 B1* | 12/2001 | Kunde | ................ | G01D 5/145 324/144 |
| 6,376,933 B1* | 4/2002 | Goetz | ................ | G01R 33/09 307/91 |
| 7,191,072 B2* | 3/2007 | Champion | ............ | G01D 21/02 340/612 |
| 7,830,294 B2* | 11/2010 | Feldotte | ............. | H03M 1/0607 341/155 |
| 9,000,824 B2* | 4/2015 | Miyazaki | ............... | H03K 5/003 327/307 |
| 9,234,768 B2* | 1/2016 | Pradhan | ................ | G01D 1/00 |
| 9,506,996 B2* | 11/2016 | Granig | ................ | G01R 33/091 |
| 9,523,742 B2* | 12/2016 | Towne | ............... | G01R 33/0041 |
| 2001/0026164 A1* | 10/2001 | Ferri | ................ | G01D 3/08 324/725 |
| 2002/0067255 A1* | 6/2002 | Tanizawa | ............... | G01L 9/045 340/514 |
| 2002/0100948 A1* | 8/2002 | Yoshihara | ............ | G01L 9/0054 257/415 |
| 2006/0052967 A1* | 3/2006 | Champion | ............ | G01D 21/02 702/127 |
| 2007/0295095 A1* | 12/2007 | Kurtz | ................ | G01M 3/3236 73/714 |
| 2008/0012557 A1* | 1/2008 | Hammerschmidt | ... | B82Y 25/00 324/252 |
| 2008/0186019 A1* | 8/2008 | Hinz | ................ | G01D 5/145 324/207.21 |
| 2009/0001965 A1* | 1/2009 | Ausserlechner | ....... | G01D 5/145 324/202 |
| 2010/0219822 A1* | 9/2010 | Suzuki | ................ | G01D 1/00 324/252 |
| 2010/0321014 A1* | 12/2010 | Butzmann | ............... | B82Y 25/00 324/252 |
| 2011/0221433 A1* | 9/2011 | Ohta | .................... | B82Y 25/00 324/252 |
| 2011/0227569 A1* | 9/2011 | Cai | ......................... | B82Y 25/00 324/252 |
| 2012/0068698 A1* | 3/2012 | Chen | .................... | G01R 33/098 324/252 |
| 2012/0166122 A1* | 6/2012 | Bottinelli | ........... | G01R 33/0029 702/85 |
| 2012/0280681 A1* | 11/2012 | David | ................ | G01R 33/0029 324/251 |
| 2013/0187645 A1* | 7/2013 | Pannetier-Lecoeur | | G01R 15/205 324/252 |
| 2014/0009146 A1* | 1/2014 | Blagojevic | ............ | G01R 33/04 324/252 |
| 2014/0245808 A1* | 9/2014 | Pradhan | ................ | G01L 27/002 73/1.08 |
| 2015/0108971 A1* | 4/2015 | Granig | ................ | G01R 33/091 324/252 |
| 2015/0276894 A1* | 10/2015 | Ricotti | ................ | G01R 33/07 324/251 |
| 2015/0285691 A1* | 10/2015 | Caffee | ..................... | G01K 7/24 374/184 |
| 2016/0003880 A1* | 1/2016 | Deschildre | ......... | G01C 19/5776 324/705 |
| 2016/0048266 A1* | 2/2016 | Smith | ................ | G06F 3/0418 345/174 |
| 2016/0178397 A1* | 6/2016 | Jost | .......................... | G01D 5/16 324/207.12 |
| 2016/0282426 A1* | 9/2016 | Zhong | ................ | G01R 33/093 |
| 2016/0313407 A1* | 10/2016 | Towne | ............... | G01R 33/0041 |
| 2016/0341800 A1* | 11/2016 | Schapendonk | .... | G01R 33/0023 |
| 2016/0377501 A1* | 12/2016 | Agarwal | ................ | G01L 25/00 73/1.15 |
| 2017/0010723 A1* | 1/2017 | Smith | ..................... | G06F 3/045 |
| 2017/0131333 A1* | 5/2017 | Schapendonk | ........ | G01R 27/02 |

FOREIGN PATENT DOCUMENTS

| | | |
|---|---|---|
| EP | 0 967 462 A1 | 12/1999 |
| JP | 2001-272293 A | 10/2001 |
| JP | 2011-257347 A | 12/2011 |

OTHER PUBLICATIONS

Extended European Search Report for EP Patent Appln. No. 14172427.8 (dated Dec. 18, 2014).

* cited by examiner

SENSOR SYSTEM WITH A FULL BRIDGE CONFIGURATION OF FOUR RESISTIVE SENSING ELEMENTS

CROSS-REFERENCE TO RELATED APPLICATIONS

This application claims the priority under 35 U.S.C. § 119 of European patent application no. 14172427.8, filed on Jun. 13, 2014, the contents of which are incorporated by reference herein.

FIELD OF THE INVENTION

The present invention relates to a sensor system having resistive sensing elements, which are arranged in a full bridge configuration.

BACKGROUND OF THE INVENTION

In many sensor applications the sensing elements are resistors which are influenced by a physical quantity to be measured. In order to produce a reliable and a sensitive sensor output, the sensing elements may be connected in a full bridge configuration or so-called Wheatstone bridge configuration. Such a configuration yields a balanced differential output voltage between two intermediate nodes. This differential output voltage is proportional to a supply or bias voltage being applied to the arrangement of the whole full bridge configuration.

In order to perform a digital signal processing analogue bridge signals being present at the two intermediate nodes can be connected to the inputs of a differential high accuracy Analog-to-Digital Converter (ADC) which converts the differential output voltage being given by the difference between the two analog bridge signals into the digital domain. The performance of an ADC is to a large extent determined by the accuracy of two reference voltage levels. Each reference voltage level can be provided by a reference voltage source.

It is known to derive the two reference voltage levels for the ADC indirectly from the supply voltage by means of an appropriate circuitry, which may comprise e.g. voltage dividers. However, this solution for realizing the reference voltage sources providing the two reference voltage levels has the drawback that it is very difficult to generate low noise and accurate reference voltage levels. Further, a significant fraction of the power consumed by the ADC will be used for the generation of the reference voltage levels. Furthermore, in particular with high frequency noise being present at the supply voltage the frequency bandwidth of the reference voltage levels will be different than the frequency bandwidth of the bridge signals. This means that high frequency noise being present on the supply voltage will not be suppressed due to a phase and/or amplitude difference between signal and reference, but will be converted into the digital domain. This could even result in an unwanted aliasing. High frequency noise can further fold back into the Band of Interest (BOI) of the ADC. Moreover, in particular in case of a comparatively intense noise being present on the supply voltage, a large full signal swing of the differential output voltage must be processed by the ADC, resulting in high linearity requirements of the ADC.

As a consequence of the drawbacks mentioned above, the performance of a known sensor system comprising sensing elements being arranged in a full bridge configuration and an ADC for providing a digital output is deteriorated.

OBJECT AND SUMMARY OF THE INVENTION

There may be a need for providing a high performance sensor system comprising (a) sensing elements being arranged in a full bridge configuration and (b) a Analog-to-Digital Converter.

This need may be met by the subject matter according to the independent claim. Advantageous embodiments of the present invention are described by the dependent claims.

According to a first aspect of the invention there is provided a sensor system. The provided sensor system comprises (a) a first sensor path, (b) a second sensor path, and (c) a processing unit. The first sensor path comprises (a1) a first sensing element and a second sensing element being connected in series between a first supply terminal and a second supply terminal and (a2) an intermediate node being provided in between the first supply terminal and the second supply terminal. The second sensor path comprises (b1) a third sensing element and a fourth sensing element being connected in series between the first supply terminal and the second supply terminal, wherein the third sensing element is subdivided into a first third subcomponent and a second third subcomponent and the fourth sensing element is subdivided into a first fourth subcomponent and a second fourth subcomponent, (b2) a first reference node being provided in between the first supply terminal and the second supply terminal, and (b3) a second reference node being provided in between the first supply terminal and the second supply terminal and being different from the first reference node. The processing unit (c1) receives an input signal from the intermediate node, a first reference signal from the first reference node, and a second reference signal from the second reference node and (c2) is configured for providing a sensor output signal based on the input signal, the first reference signal and the second reference signal.

The described sensor system is based on the idea that the effect of voltage ripples being present on a (power) supply voltage being applied to the first supply terminal and/or to the second supply terminal can be effectively reduced by providing reference signals for the processing unit, which reference signals track or follow these voltage ripples. This means that when the supply voltage increases, the reference signals increase proportionally. Correspondingly, when the supply voltage decreases the reference signals decrease proportionally.

A further basic idea of the described sensor system can be seen in that the reference signal being used by the processing unit are derived from the second sensor path of the full bridge configuration of sensing element. This results in a reference for the processing unit which will track the supply voltage and has the same common mode level as the input signal derived from the first sensor path of the full bridge configuration.

Put in other words: When the reference signals follow fluctuations of the (power) supply voltage the input range for the processing unit as well as the input signal respectively the reference signals for the processing unit scale with the (power) supply voltage. This may result in an output signal being provided by the processing unit respectively by the whole sensor system, which output signal is at least to a large extend independent of the (power) supply voltage.

The voltage ripples may be caused in particular by noise, which in reality can never be eliminated completely. Therefore, with the described sensor system the accuracy of a sensor output signal will be improved for all types of sensor applications being based on a full bridge configuration of sensing elements.

The analog signals may be in particular voltage signals. The output signal may be any type of signal. Even an optical signal may be possible.

In accordance with the described sensor system the first sensor path is used for generating the input signal. Therefore, the first sensor path may also be denominated a signal path. Further, the second sensor path is used for generating the two reference signals. Therefore, the second sensor path may also be denominated a reference path. Of course, due to symmetry also the first sensor path may be the reference path and the second sensor path may be the signal path.

According to an embodiment the processing unit comprises an Analog-Digital-Converter. This may provide the advantage that the sensor output signal may be a digital output signal which can be further processed in a reliable manner by means of further digital circuitry.

Due to the above elucidated supply voltage tracking of both the input signal and the at least two reference signals the accuracy of the digital output signal provided by the analog-digital conversion of the analog-digital converter (ADC) will be improved for all types of sensor application.

According to a further embodiment the sensor system further comprises a power supply source being connected to the first supply terminal and the second supply terminal.

Using an (integrated) power supply source may provide the advantage that the sensor system can be realized as an autarkic or self-sustaining system, which could be employed in an easy manner for a variety of sensor applications.

According to a further embodiment at least one of the sensing elements is a magnetic sensing element. This may mean that the (full bridge) sensing element configuration represents a (full bridge) magnetic sensor arrangement and the described sensor system is a magnetic sensor system. Such a magnetic sensor system can be employed in a variety of sensor applications such as for instance in the automotive industry e.g. for high precision ABS sensors and for measuring in a highly reliable manner e.g. the rotational position of a crankshaft of a combustion engine.

Preferably, the magnetic sensing element is a magnetoresistive sensing element. This may allow for obtaining magnetic field measurements in a highly precise manner. In particular, the magnetoresistive sensing elements may be AMR sensing elements the operation of which relies on the known anisotropic magnetoresistance (AMR). It is mentioned that also other sensing elements may be used which rely e.g. on the known effect of giant magnetoresistance (GMR), colossal magnetoresistance (CMR) and/or tunnel magnetoresistance (TMR).

It is mentioned that the described electric wiring between the two sensor paths on the one hand and the processing unit on the other hand may also be used in a beneficial manner for other types of sensor systems such as e.g. a sensor system for measuring a temperature in a reliable and precise manner.

According to a further embodiment each one of the four sensing elements is a magnetic sensing element. This may provide the advantage that the sensor system can be arranged in a symmetric manner and known full bridge configurations of sensing elements can be used.

According to a further embodiment the sensing elements are formed on or over a single substrate die and in particular on or over a single semiconductor die. This may provide the advantage that the sensor arrangement of the sensor system or even the whole sensor system comprising inter alia the described processing unit can be produced by means of a common semiconductor manufacturing process. This allows for realizing the described sensor system in an effective manner with respect to the production costs.

By contrast to known sensor systems being formed at least partially on or over a substrate the described sensor system does not need reference voltage sources because the required reference signals are indirectly obtained from the power supply source via appropriate nodes within the second sensor path. This may provide the advantage that the area on the substrate, which is normally needed for forming at least one reference voltage source, is no more needed. As a consequence, the described sensor system can be realized in a spatially compact manner. This may be in particular of advantage when the described sensor system is formed integrally on a semiconductor substrate.

According to a further embodiment the first sensing element is subdivided into a first first subcomponent and a second first subcomponent and the second sensing element is subdivided into a first second subcomponent and a second second subcomponent. This may mean that the full bridge configuration of the sensing elements can be realized in a symmetric manner. Such a symmetric configuration may be in particular of great advantage, when the sensing elements are realized at a semiconductor level. This means that sensing elements may be formed directly or indirectly on or over a semiconductor substrate.

In this respect it is mentioned, that the formation of the sensing elements on or over a semiconductor substrate may provide the possibility that each sensing element can be contacted with additional signal wires or with additional reference wires in an easy and reliable manner. Such additional wires may be used to feed the processing unit with additional input respectively reference signals such that the output signal can be generated in a precise and reliable manner. The use of additional input respectively reference signals may further provide the opportunity to use specific types of digital processing units such as e.g. a sigma delta modulator or a so-called differential flash ADC which may convert different input and reference signals in a parallel manner in order to provide a digital output signal in an extremely fast manner. Further information regarding these types of digital processing unit will be presented below.

According to a further embodiment all subcomponents exhibit a certain ohmic resistance and the ohmic resistances of the following pairs of subcomponents are equal or for all of the following pairs of subcomponents the ohmic resistance of the subcomponent being assigned to the first sensor path and the ohmic resistance of the subcomponent being assigned to the second sensor path has a fixed ratio: (a) first first subcomponent and second fourth subcomponent, (b) second second subcomponent and first third subcomponent, (c) second first subcomponent and first fourth subcomponent, and (d) second third subcomponent and first fourth subcomponent.

Choosing the resistance value of the various subcomponents in the described manner makes the full bridge sensor configuration not only symmetric from a structural point of view but also symmetric with respect to the (voltage) levels of the at least one input signal and the at least two reference signals all being fed to the processing unit. This makes the design and in particular the selection of appropriate resistance values for the subcomponents of the two sensor paths very simple.

The fixed ratio, which may be selected depending on the electrical current being available for operating the described sensor system, may have principally any value between zero (excluded) and infinite. Preferably, the fixed ratio may be between 0.01 and 100 and preferably between 0.1 and 10.

According to a further embodiment the ohmic resistance behaviors of all subcomponents are selected in such a manner that when the operational state of the sensor system changes the sum of the ohmic resistances of the following pairs of subcomponents remains constant: (a) first first subcomponent and second second subcomponent, (b) second first subcomponent and first second subcomponent, (c) first third subcomponent and second fourth subcomponent, and (d) second third subcomponent and first fourth subcomponent.

As a consequence of selecting the ohmic resistance behavior and the values of the ohmic resistances of the subcomponents in the described manner the design of the sensor system may be further simplified.

In this respect the term "operational state of the sensor system" may mean in particular that the physical quantity which is supposed to be measured by the described sensor system has a certain value or level. This means that the described sensor system exhibits a transition from a first operational state to a second operational state when the physical quantity to be measured changes its value. As described above, the physical quantity may be for instance the strength of a magnetic field or the temperature of a certain spatial region in which at least the sensor arrangement comprising the four sensing elements is located.

Further, the term "ohmic resistance behavior" may denominate the dependency of the value of the ohmic resistance of the respective subcomponent as a function of the physical quantity to be measured by the described sensor system.

According to a further embodiment (a) within the first signal path there is provided (a1) a first intermediate node coinciding with the intermediate node between the first first subcomponent and the second first subcomponent and (a2) a second intermediate node between the first second subcomponent and the second second subcomponent, and (b) within the second signal path (b1) the first reference node is between the first third subcomponent and the second third subcomponent and (b2) the second reference node is between the first fourth subcomponent and the second fourth subcomponent. Further, (c) the sensor system further comprises (c1) a first resistor chain comprising at least two first resistors being connected in series between the first intermediate node and the second intermediate node and (c2) a second resistor chain comprising at least two second resistors being connected in series between the first reference node and the second reference node. Further, (d) the processing unit is a digital processing unit which receives (d1) at least one input tap signal from at least one first inner node of the first resistor chain and (d2) at least one reference tap signal from at least one second inner node of the second resistor chain. Further, (e) the processing unit is configured for providing the sensor output signal as a digital signal based on (e1) a first input signal being the input signal, (e2) a second input signal from the second intermediate node, (e3) the at least one input tap signal, (e4) the first reference signal from the first reference node, (e5) the second reference signal from the second reference node, and (e6) the at least one reference tap signal.

The sensor system described with this embodiment comprises a circuitry arrangement wherein all input signals and reference signal can be combined pairwise with each other. As a result, input signals and reference signals have an equal bandwidth. This may result in a maximum suppression of noise or disturbances generated by a power source providing the supply voltage to the first supply terminal and/or to the second supply terminal.

According to a further embodiment the second first subcomponent and the first second subcomponent represent at least a part of the first resistor chain. Alternatively or preferably in combination the second third subcomponent and the first fourth subcomponent represent at least a part of the second resistor chain.

With respect to the input signal generation part of the sensor system this may mean that only the first first subcomponent and the second second subcomponent are sensing subcomponents. With respect to the reference signal generation part of the sensor system this may mean that only the first third subcomponent and the second fourth subcomponent are sensing subcomponents. In this respect a sensing subcomponent may be an element which changes its resistance as a function of the physical quantity (e.g. the magnetic field) to be measured by the sensor system.

By integrating the second first subcomponent and the first second subcomponent into the first resistor chain and/or by integrating the second third subcomponent and the first fourth subcomponent into the second resistor chain, the number of electronic components of the whole sensor system can be kept small. As a consequence, both the complexity of the sensor system itself and the complexity of the production process of the sensor system can be kept simple.

According to a further embodiment the processing unit comprises a comparator unit and a decoding unit. Thereby, the comparator unit comprises at least one comparator element wherein each one of the at least one comparator element receives (i) as a first input signal one of the first input signal, the at least one input tap signal, and the second input signal and (ii) as a second input signal one of the first reference signal, the at least one reference tap signal, and the second reference signal. Further, the decoding unit is configured for providing the sensor output signal in response to the output signals of the at least one comparator element.

When the comparator unit comprises at least two comparator elements the circuitry between the two resistor chains and the at least two comparator elements is such that another comparator element receives (i) as a first input signal another one of the first input signal, the at least one input tap signal, and the second input signal, and (ii) as a second input signal another one of the first reference signal, the at least one reference tap signal, and the second reference signal. Descriptive speaking, the various input signals from the first resistor chain and the reference signals from the second resistor chain are fed crosswise to the comparator unit.

It is mentioned that the number of comparator elements is higher by one than the number of resistors in each resistor chain.

It is further mentioned that the number of comparator elements corresponds to the resolution of the described processing unit. Specifically, when the number of comparator elements is n the processing unit respectively the whole sensor system comprises a log 2(n)-bit resolution. This means that 4 comparator elements yield a 2-bit resolution, 8 comparator elements yield a 3-bit resolution, 16 comparator elements yield a 4-bit resolution, etc.

The sensor system described with this embodiment relies on the design of a differential Flash ADC. Such a type of ADC is known by persons skilled in the art. Therefore, in this document, for the sake of conciseness the design and the basic principles of such a differential flash ADC will not be described in detail.

Since in such a design for converting sensor signals into the digital output signal the processing of the various signals being supplied to the digital processing unit can be carried out in parallel, the described sensor system relying on a differential flash ADC is very fast and can be used in particular for high frequency applications.

According to a further embodiment (a) the processing unit comprises a sigma delta converter and a coding unit, (b) the sensor system further comprises at least one first switch being connected with the first resistor chain in such a manner that a central signal node is selectively coupleable with the first intermediate node, the second intermediate node, and the at least one first inner node, (c) the sensor system further comprises at least one second switch being connected with the second resistor chain in such a manner that a central reference node is selectively coupleable with the first reference node, the second reference node, and the at least one second inner node, (d) the central signal node and the central reference node are connected to an input side of the sigma delta converter, (e) the sigma delta converter is configured for providing the sensor output signal, and (f) the coding unit is configured for receiving the sensor output signal and for controlling the at least one first switch and the at least one second switch in response to the received sensor output signal.

The sensor system described with this embodiment relies on the known design of a sigma delta converter. In accordance with the working principle of a sigma delta converter and the basic circuitry used for the described sensor system the sigma delta converter tries, in particular by means of an iterative try and error procedure, to provide an appropriate sensor output signal to the coding unit. With this appropriate sensor output signal the coding unit controls all the first switches and all the second switches in such a manner that the voltage levels at the central signal node and at the central reference node are at least approximately equal. In order to achieve such an operational state the sigma delta converter together with the coding unit continuously search for a proper switching pattern of all switches by toggling between different combinations of switching patterns.

The sigma delta converter may comprise an amplifier or a voltage to current converter, which at its input side is connected with the central signal node and with the central reference node. The sigma delta converter may further comprise a single bit or a multi bit ADC being connected downstream of the amplifier or the voltage to current converter and providing the (digital) sensor output signal. Further, the sigma delta converter may comprise an integrator in between (a) the amplifier or voltage to current converter and (b) the single bit or multi bit ADC.

When using a sigma delta converter for the sensor system described in this document the digital processing for the analog-digital conversion is carried out in an iterative manner. Therefore, although being not as fast as the above described differential Flash ADC the described sensor system relying on a sigma delta converter is very precise and can be used in particular for applications requiring a high accuracy. This may mean that instead of being capable of operating with a high speed the "sigma delta converter sensor system" may provide a high linearity.

It is mentioned that a sigma delta converter by itself is known by persons skilled in the art. Therefore, in this document, for the sake of conciseness the design and the basic principles of such a sigma delta converter will not be described in more detail.

It is further mentioned that the number of first switches and the (same) number of second switches is higher by one than the number of resistors in each resistor chain.

Specifically, when the number of switches of each type is n the sigma delta converter respectively the whole sensor system exhibits a n-bit resolution.

According to a further embodiment (a) the second signal path comprises a further intermediate node, (b) the second sensor path is designed such that (b1) the second reference node is in between the first third subcomponent and the second third subcomponent, (b2) the further intermediate node is in between the second third subcomponent and the first fourth subcomponent, and (b3) the first reference node is in between the first fourth subcomponent and the second fourth subcomponent, and (c) the processing unit further (c1) receives a further input signal from the further intermediate node and (c2) provides the sensor output signal further based on the further input signal.

In this embodiment of the sensor system the input signal may represent a bridge signal originating from the first sensor path and the further input signal may represent a further bridge signal originating from the second sensor path. Preferably, this bridge signal and the further bridge signal are processed by the processing unit as a differential signal input, which in accordance with the basic principles of a Wheatstone bridge may represent very precise measurement signal.

In this respect it is mentioned that for this sensor configuration it is not essential but nevertheless possible that the first sensing element is subdivided into two first subcomponents and that the second sensing element is subdivided into two second subcomponents because there is no need for obtaining any signal from the "interior" of the first sending element and/or from the "interior" of the second sensing element. However, as has already been mentioned above, subdividing the first sensing element and the second sensing element may be of advantage when realizing the sensing elements with an appropriate semiconductor manufacturing process.

For realizing a high performance of the sensor system described with this embodiment there may be used two buffer elements. Thereby, a first buffer element may be arranged within a first reference line between the first reference node and the processing unit and the second buffer element may be connected within a second reference line extending between the second reference node and the processing unit, Each one of the described buffers, which are optional for the described sensor system, may comprise or may consist of an amplifier having a gain of one. This means that the respective buffer is used as an impedance converter.

The aspects defined above and further aspects of the present invention are apparent from the examples of embodiment to be described hereinafter and are explained with reference to the examples of embodiment. Embodiments of the invention will be described in more detail hereinafter with reference to examples of embodiment but to which the invention is not limited

DESCRIPTION OF EMBODIMENTS

Figure 1:
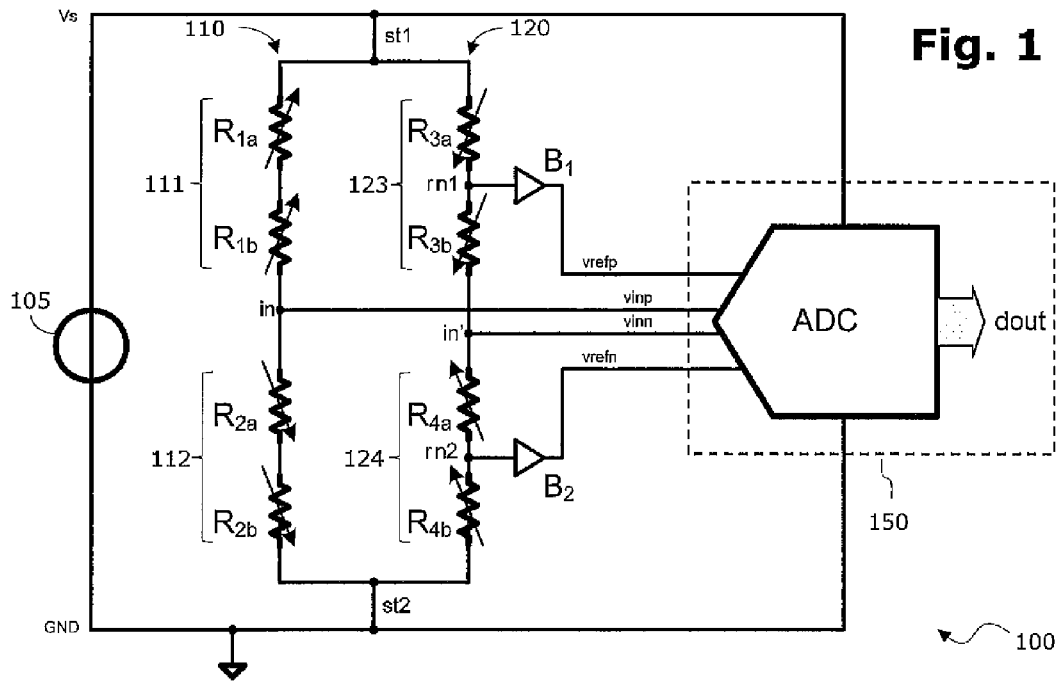
FIG. 1 shows a sensor system according to a first embodiment of the invention, wherein a differential signal being the difference between two bridge signals is converted from the analog into the digital domain.

The illustration in the drawing is schematically. It is noted that in different figures, similar or identical elements or features are provided with the same reference signs or with reference signs, which are different from the corresponding reference signs only within the first digit. In order to avoid unnecessary repetitions elements or features which have already been elucidated with respect to a previously described embodiment are not elucidated again at a later position of the description.

It should be noted that the term "comprising" does not exclude other elements or steps and "a" or "an" does not exclude a plurality. Also elements described in association with different embodiments may be combined. It should also be noted that reference signs in the claims should not be construed as limiting the scope of the claims.

FIG. 1 shows a sensor system 100 according to a first embodiment of the invention. The sensor system 100 comprises a power supply source 105, which according to the embodiment described here is a supply voltage source 105 providing, with respect to a ground voltage level GND, a supply voltage Vs. The supply voltage Vs is supplied to the sensor system 100 via a first supply terminal st1 and the ground voltage level GND is supplied to the sensor system 100 via a second supply terminal st2.

The sensor system 100 further comprises a sensor arrangement with two sensor paths, a first sensor path 110 and a second sensor path 120. The sensor arrangement is a full bridge configuration or a so called Wheatstone bridge configuration of four resistive sensing elements. A first sensing element 111 and a second sensing element 112 are assigned to the first sensor path 110. A third sensing element 123 and a fourth sensing element 124 are assigned to the second sensor path 120.

The first sensor path 110 comprises an intermediate node in, which is arranged between the first sensing element 111 and the second sensing element 112. Accordingly, the second sensor path 120 comprises further intermediate node in, which is arranged between the third sensing element 123 and the fourth sensing element 124. In accordance with known full bridge sensor configurations, a processing unit 150 of the sensing system 100 receives a differential input signal consisting of an input signal vinp and a further input signal vinn. When taking into account the full bridge configuration of the sensing elements 111, 112, 123, and 124 the input signal vinp can be seen as a first bridge signal and the further input signal vinn can be seen as a second bridge signal. The difference of the voltage levels between these two bridge signals is converted in a known manner by means of an analog-digital converter ADC of the processing unit 150 into a digital sensor output signal dout.

In order to realize an accurate analog-digital conversion the analog-digital converter ADC has to be provided, in addition to the supply voltage Vs and the ground voltage level GND, with appropriate reference signals, namely a first reference signal vrefp and a second reference signal vrefn. In known sensor systems comprising a full bridge configuration of sensing elements such reference signals are obtained or generated by means of appropriate voltage sources.

In accordance with the embodiment described here both the first reference signal vrefp and the second reference signal vrefn are derived from either the first sensor path 110 or the second sensor path 120. As can be seen from FIG. 1, for this purpose the third sensing element 123 is subdivided into a first third subcomponent R3a and a second third subcomponent R3b. Further, the fourth sensing element 124 is subdivided into a first fourth subcomponent R4a and a second fourth subcomponent R4b. Specifically, the first reference signal vrefp is derived from a first reference node rn1 being located in between the first third subcomponent R3a and the second third subcomponent R3b. Accordingly, the second reference signal vrefn is derived from a second reference node rn2 being located in between the first fourth subcomponent R4a and the second fourth subcomponent R4b.

Also not necessary for realizing the sensor system 100 according to the embodiment described here, also the first sensing element 111 and the second sensing element 112 are subdivided respectively into two subcomponents. Specifically, the first sensing element 111 is subdivided into a first first subcomponent R1a and a second first subcomponent R1b. Further, the second sensing element 112 is subdivided into a first second subcomponent R2a and a second second subcomponent R2b. The subdivision of the sensing elements 111 and 112 may be of advantage in particular if the sensor arrangement comprising the two sensing paths 110 and 120 is formed integrally on or over a semiconductor substrate. In this respect a symmetric sensor arrangement may be easier to produce than an asymmetric sensor arrangement wherein only the sensing elements of one sensor path are subdivided into two subcomponents.

The sensor system 100 described with FIG. 1 further comprises two optional amplifiers or buffers B1 and B2, which are connected or inserted within the signal paths carrying the first reference signal vrefp respectively the second reference signal vrefn. These amplifiers B1 and B2, which may have a gain of 1, provide an impedance conversion. Therefore, the amplifiers B1 and B2 are only needed if the input impedances of the reference inputs of the processing unit 150 respectively of the analog-digital converter ADC are low as compared to the impedances of the two sensor paths 110 and 120.

According to the embodiment described here all sensing elements 111, 112, 123, and 124 are subdivided into two separate resistive sensing subelements or subcomponents R1x, R2x, R3x, and R4x, wherein x is either 1 or 2. The ratio between Rxa and Rxb should be chosen in such a manner that a voltage drop across R3b and R4a is larger than or equal to the differential voltage signal vinp–vinn.

In the described configuration the reference (voltage) signals vrefp and vrefn exactly track or follow the supply voltage Vs. This means that when the supply voltage Vs changes e.g. because of noise, the reference signals vrefp and vrefn change proportionally. This may allow for obtaining a high accurate analog-digital conversion. Further, since the reference signals vrefp and vrefn are derived from the second sensor path 120 of the full bridge configuration of sensing elements 111, 112, 123, and 124, the reference signals vrefp and vrefn will have the same common mode level as the input signals vinp and vinn derived from the first sensor path 110 and from the second sensor path 120.

It is mentioned that when the amplifiers B1 and B2 are not needed (e.g. when the input impedances of the processing unit 150 have the same order or are high as compared to the impedances of the sensor paths 110, 120), the frequency bandwidth for the input signals vinp, vinn and for the reference signals vrefp, vrefn will be at least approximately the same. This may allow for a high accurate analog-digital conversion within a wide frequency bandwidth.

The described electric wiring between the two sensor paths 110 and 120 on the one hand and the processing unit 150 on the other hand may be used in a beneficial manner for many different types of sensor systems. However, a presently preferred application of the described concept is a magnetic sensor system, which may be used for a precise measurement of the strength and/or of the direction of a magnetic field e.g. in the automotive industry for instance in the field of high precision ABS sensors. Preferably, the magnetic sensing elements are magnetoresistive sensing elements such as AMR sensing elements the operation of which relies on the known anisotropic magnetoresistance (AMR).

In case of a magnetoresistive sensor system the magnetoresistive sensing elements should be configured and/or their directions of easy magnetizations should be oriented in such a manner that, when the strength of the detected magnetic field increases, (a) the ohmic resistance of the first sensing element 111 (and its subcomponents R1$a$ and R1$b$) as well as the ohmic resistance of the fourth sensing element 124 (and its subcomponents R4$a$ and R4$b$) increase by the same amount as (b) the ohmic resistance of the second sensing element 112 (and its subcomponents R2$a$ and R2$b$) and the ohmic resistance of the third sensing element 123 (and its subcomponents R3$a$ and R3$b$) decreases. In this way, which in FIG. 1 is illustrated by the direction of the arrows of all subcomponents, the full bridge configuration of the sensing elements 111, 112, 123, 124 can be kept balanced in different operational states respectively in the presence of different magnetic fields. In a preferred configuration of the sensor system 100 the resistance values of the various subcomponents may fulfill the following conditions:

(1) R1$a$=R4$b$; R2$b$=R3$a$; R1$b$=R4$a$; and R2$a$=R3$b$
(2) R1$a$+R2$b$=constant; R1$b$+R2$a$=constant; R3$a$+R4$b$=constant; R3$b$+R4$a$=constant;
(3) Without a magnetic field: R1$b$=R2$a$=R3$b$=R4$a$; R1$a$=R2$b$R3$a$R4$b$.

The digital signal clout provided by the sensor system 100 is given by:

$$d\text{out}=(v\text{in}p-v\text{in}n)/(v\text{ref}p-v\text{ref}n)*2^n$$

Thereby, n is the bit resolution of the used analog-digital converter ADC.

Figure 2:
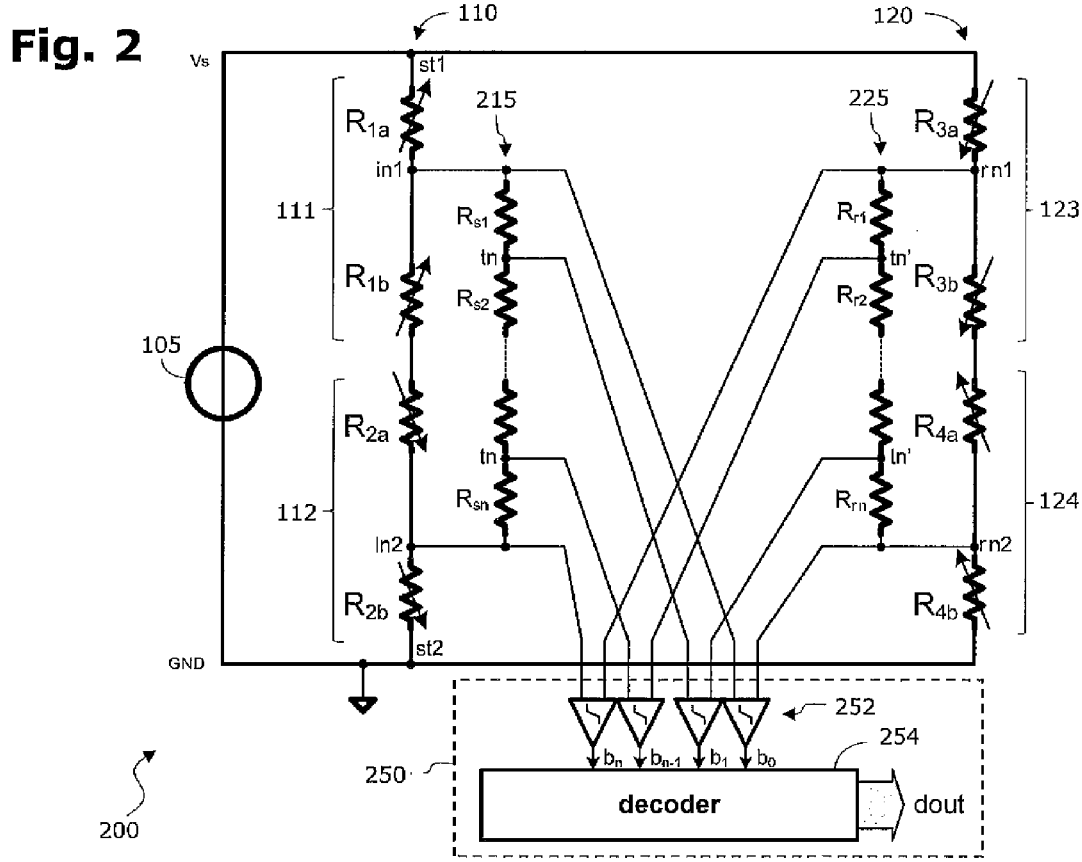
FIG. 2 shows a sensor system according to a second embodiment of the invention, wherein an analog-digital conversion relies on the concept of a differential Flash ADC.

FIG. 2 shows a sensor system 200 wherein the frequency bandwidth for input signals is the same as the frequency bandwidth for reference signals. This is achieved in that all reference signals for the analog-digital conversion performed by a processing unit 250 are derived from the sensing bridge. According to the embodiment described here, the processing unit 250 is a so called differential Flash ADC which comprises (i) a comparator unit 252 with a plurality of comparator elements b0, b1, . . . , bn and (ii) a decoding unit 254 being coupled with the comparator unit 252.

In addition to the circuitry presented in FIG. 1, the sensor system 200 comprises two resistor chains each comprising a serial connection or a ladder arrangement of ohmic resistors. Specifically, a first resistor chain 215 comprising first resistors Rs1, Rs2, . . . , Rsn is connected in parallel with respect to the series connection of the second first subcomponent R1$b$ and the first second subcomponent R2$a$. Further, a second resistor chain 225 comprising second resistors Rr1, Rr2, . . . , Rrn is connected in parallel with respect to the series connection of the second third subcomponent R3$b$ and the first fourth subcomponent R4$a$.

As can be seen from FIG. 2, a plurality of input signals is generated by the first sensor path 110 respectively by the first resistor chain 215. All these generated input signals are fed into the comparator unit 252, wherein respectively one input signal is assigned to a first (left) input terminal of one of the comparator elements b0, b1, . . . , bn. A first input signal is taken from a first intermediate node in1, which is located in between the first first subcomponent R1$a$ and the second first subcomponent R1$b$. A second input signal is taken from a second intermediate node in2, which is located in between the first second subcomponent R2$a$ and the second second subcomponent R2$b$. At least one input tap signal (in FIG. 2 there are explicitly shown two input tap signals) is taken from at least one first inner node tn.

As can be further seen from FIG. 2, a plurality of reference signals is generated by the second sensor path 120 respectively by the second resistor chain 225. All these generated reference signals are fed into the comparator unit 252, wherein respectively one reference signal is assigned to a second (right) input terminal of one of the comparator elements b0, b1, . . . , bn. A first reference signal is taken from a first reference node rn1 being located in between the first third subcomponent R3$a$ and the second third subcomponent R3$b$. A second reference signal is taken from the second reference node rn2 being located in between the first fourth subcomponent R4$a$ and the second fourth subcomponent R4$b$. At least one reference tap signal (in FIG. 2 there are explicitly shown two reference tap signals) is taken from at least one second inner node tn'.

It is mentioned that the accuracy of the described differential flash analog-digital conversion is a direct function of the number n of the first resistors Rs1, Rs2, . . . , Rsn respectively of the second resistors Rr1, Rr2, . . . , Rrn.

As has already been mentioned above with respect to the sensor system 100, the full bridge configuration will be balanced for different operational states when the ohmic resistance values of the various subcomponents R1$a$, R1$b$, R2$a$, R2$b$, R3$a$, R3$b$, R4$a$, and R4$b$ fulfill at least some of the above identified conditions (1), (2), and (3). If the same conditions are fulfilled also by the sensor system 200, the accuracy of the sensor system 200 will be very high.

It is pointed out, that the sensor system 200, which relies on the principle of the differential Flash ADC, may be in particular of great advantage when an analog-digital conversion should be carried out very fast. This means that the sensor system 200 can be used in particular for high frequency applications. Thereby, a "high frequency" may be given when at least one of (i) the physical quantity to be measured and (ii) the noise being present on the supply voltage Vs has a high frequency.

Figure 3:
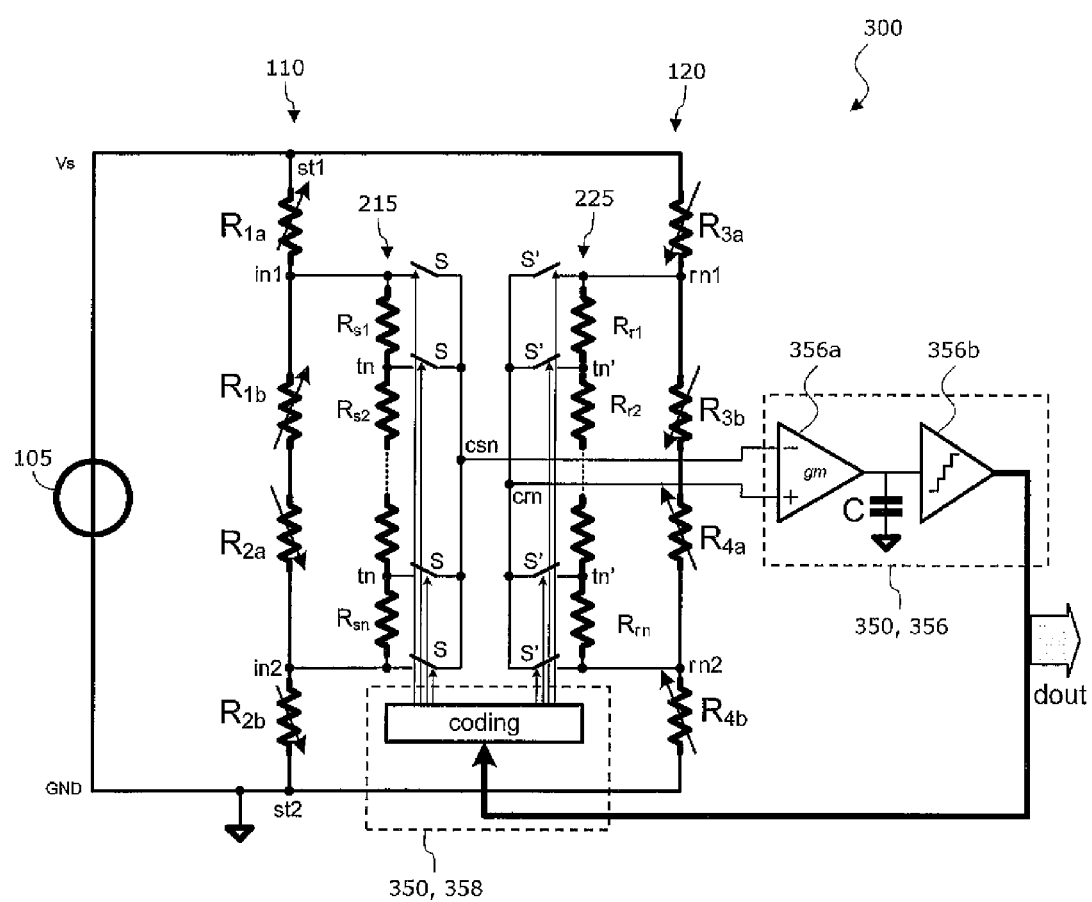
FIG. 3 shows a sensor system according to a third embodiment of the invention, wherein an analog-digital conversion relies on the concept of a sigma delta converter.

FIG. 3 shows a sensor system 300 according to a third embodiment of the invention, wherein an analog-digital conversion relies on the concept of a sigma delta converter. This sensor system 300 provides the biggest advantages for applications where instead of a high speed a good linearity is required. The sensor system 300 shown in FIG. 3 comprises a multi-bit converter. However, the same topology can also be used for a single bit sigma delta converter.

In accordance with the known basic principle of a sigma delta conversion the first nodes of the first resistor chain 215 are selectively connected to a central signal node csn by means of respectively one first switch S. As can be seen from FIG. 3, these first nodes are given by the first intermediate node in1, the second intermediate node in2, and at least one first inner node tn. Further, the second nodes of the second resistor chain 225 are selectively connected to a central reference node crn by means of respectively one second switch S'. As can be seen from FIG. 3, these second nodes are given by the first reference node rn1, the second reference node rn2, and at least one second inner node tn'. The positions of all first switches S and all second switches S' are controlled by a coding unit 358 representing a part of a processing unit 350 of the sensor system 300.

The processing unit 350 further comprises a sigma delta converter 356, which according to the embodiment described here consists of a voltage-current converter 356a, an integrating unit C and a multi bit ADC 356b. The output of the multi bit ADC 356b represents the digital output signal dout. The digital output signal clout is further used as a driving signal for the coding unit 358. In accordance with the basic principles of a sigma delta conversion, the processing unit 350 continuously and iteratively tries to find a switching pattern for all the first switches S and the second switches S', which switching pattern causes the voltage level at the central signal node csn to be equal in height with the voltage level at the central reference node crn.

As has already been mentioned above with respect to the sensor systems 100 and 200, also the full bridge configuration of the sensor system 300 will be balanced for different operational states when the ohmic resistance values of the various subcomponents R1a, R1b, R2a, R2b, R3a, R3b, R4a, and R4b fulfill at least some of the above identified conditions (1), (2), and (3).

It is mentioned that a sensor system 300 taking benefit of the special wiring described in this document could also be used in combination with any ADC based on a feedback Digital-Analog Converter (DAC), such as a SAR (Successive Approximation Register) converter. In such converters, the input signal is compared with the output of a DAC and the DAC is driven to minimize the difference between the input signal and the DAC output. The proposed DAC can be used in such a system simply by connecting the output of a DAC ladder to the input of the ADC. Such a system would then work to minimize the difference between the two DAC output signals. The driving of the DAC output would be a digital representation of the input signal.

A ladder DAC can also be used to reduce the input voltage range required for a cascaded signal processing circuit. A part of the signal can be compensated by the DAC ladder and the remaining signal can be processed by a read-out connected to the ladder, which would then have to process a smaller amplitude signal.

The circuit can also be used in a single ended configuration with only one subranging DAC connected to one input of the voltage to current converter (gm stage) and the central node being connected to the other input of the voltage to current converter.

With respect to the sensor systems 200 and 300 presented above with reference to the FIGS. 2 and 3 it is pointed out that at the left side (i.e. the input signal generating part) of the respective sensor system the second first subcomponent R1b and the first second subcomponent R2a could be omitted. In this case there would be no connection or coupling between the first intermediate node in1 and the second intermediate node in2. This means that the first resistor chain 215 would be a part of the first sensor path 110.

Correspondingly, at the right side (i.e. the reference signal generating part) of the respective sensor system 200 or 300 shown in FIG. 2 or 3 the second third subcomponent R3b and the first fourth subcomponent R4a could be omitted. In this case there would be no connection or coupling between the first reference node rn1 and the second reference node rn2. This means that the second resistor chain 225 would be a part of the second sensor path 120.

REFERENCE NUMERALS 100 sensor system
105 power supply source/supply voltage source
Vs supply voltage
GND ground
st1 first supply terminal
st2 second supply terminal
110 first sensor path
111 first sensing element
112 second sensing element
120 second sensor path
123 third sensing element
124 fourth sensing element
R1a first first subcomponent
R1b second first subcomponent
R2a first second subcomponent
R2b second second subcomponent
R3a first third subcomponent
R3b second third subcomponent
R4a first fourth subcomponent
R4b second fourth subcomponent
in intermediate node
in' further intermediate node
rn1 first reference node
rn2 first reference node
vinp input signal/first bridge signal
vinn further input signal/second bridge signal
vrefp first reference signal
vrefn second reference signal
B1 buffer
B2 buffer
150 processing unit
ADC Analog-Digital Converter
dout digital sensor output signal
200 sensor system
in1 first intermediate node
in2 second intermediate node
215 first resistor chain with first resistors Rs1, Rs2, . . . , Rsn
225 second resistor chain with second resistors Rr1, Rr2, . . . , Rrn
tn first inner node
tn' second inner node
250 processing unit
252 comparator unit with comparator elements b0, b1, . . . , bn
254 decoding unit
300 sensor system
350 processing unit
356 sigma delta converter
356a voltage-current converter
356b multi bit ADC
C integrating unit/integrating capacitor
358 coding unit
S first switches
S' second switches
csn central signal node
crn central reference node

The invention claimed is:
1. A sensor system comprising
  a first sensor path comprising a first sensing element and a second sensing element being connected in series between a first supply terminal and a second supply terminal and an intermediate node being provided in between the first supply terminal and the second supply terminal, a second sensor path comprising a third sensing element and a fourth sensing element being connected in series between the first supply terminal and the second supply terminal, wherein the third sensing element is subdivided into a first subcomponent and a second subcomponent and the fourth sensing element is subdivided into a third subcomponent and a fourth subcomponent, a first reference node being provided in between the first subcomponent and the second subcomponent, and a second reference node being provided in between the first supply terminal and the second supply terminal and being different from the first reference node, and a processing unit to receive an input signal from the intermediate node, a first reference signal from the first reference node, and a second reference signal from the second reference node and being configured for providing a sensor output signal based on the input signal, the first reference signal and the second reference signal.

2. The sensor system as set forth in claim 1, wherein the processing unit comprises an Analog-Digital-Converter.

3. The sensor system as set forth in claim 1, further comprising
a power supply source being connected to the first supply terminal and the second supply terminal.

4. The sensor system as set forth in a claim 1, wherein at least one of the sensing elements is a magnetic sensing element.

5. The sensor system as set forth in claim 1, wherein each one of the four sensing elements is a magnetic sensing element.

6. The sensor system as set forth claim 1, wherein the sensing elements are formed on a single substrate die and in particular on a single semiconductor die.

7. The sensor system as set forth in claim 1, wherein the first sensing element is subdivided into a fifth subcomponent and a sixth subcomponent and the second sensing element is subdivided into a seventh subcomponent and a eighth subcomponent.

8. The Sensor system as set forth in claim 7, wherein all subcomponents exhibit a certain ohmic resistance and wherein
the ohmic resistances of the following pairs of subcomponents are equal or for all of the following pairs of subcomponents the ohmic resistance of the subcomponent being assigned to the first sensor path and the ohmic resistance of the subcomponent being assigned to the second sensor path has a fixed ratio:
fifth subcomponent and fourth subcomponent,
eighth subcomponent and first subcomponent,
sixth subcomponent and third subcomponent,
seventh subcomponent and second subcomponent.

9. The sensor system as set forth in claim 8, wherein the ohmic resistance behaviors of all subcomponents are selected in such a manner that when the operational state of the sensor system changes the sum of the ohmic resistances of the following pairs of subcomponents remains constant:
fifth subcomponent and eighth subcomponent,
sixth subcomponent and seventh subcomponent,
first subcomponent and fourth subcomponent,
second subcomponent and third subcomponent.

10. The sensor system as set forth in claim 7,
wherein within a first signal path there is provided a first intermediate node coinciding with the intermediate node between the fifth subcomponent and the sixth subcomponent and a second intermediate node between the seventh subcomponent and the eighth subcomponent, wherein within a second signal path the first reference node is between the first subcomponent and the second subcomponent and the second reference node is between the third subcomponent and the fourth subcomponent, wherein the sensor system comprises
a first resistor chain comprising at least two first resistors being connected in series between the first intermediate node and the second intermediate node and
a second resistor chain comprising at least two second resistors being connected in series between the first reference node and the second reference node, wherein the processing unit is a digital processing unit
which receives at least one input tap signal from at least one first inner node of the first resistor chain and at least one reference tap signal from at least one second inner node of the second resistor chain and wherein the processing unit is configured for providing the sensor output signal as a digital signal based on a first input signal being the input signal, a second input signal from the second intermediate node, the at least one input tap signal, the first reference signal from the first reference node, the second reference signal from the second reference node, and the at least one reference tap signal.

11. The sensor system as set forth in claim 10, wherein the sixth subcomponent and the seventh subcomponent represent at least a part of the first resistor chain and/or the second subcomponent and the third subcomponent represent at least a part of the second resistor chain.

12. The sensor system as set forth in claim 10,
wherein the processing unit comprises a comparator unit and a decoding unit,
wherein the comparator unit comprises at least one comparator element wherein each one of the at least one comparator element receives as a first input signal one of the first input signal, the at least one input tap signal, and the second input signal and as a second input signal one of the first reference signal, the at least one reference tap signal, and the second reference signal, and
wherein the decoding unit is configured for providing the sensor output signal in response to the output signals of the at least one comparator element.

13. The sensor system as set forth in claim 10,
wherein the processing unit comprises a sigma delta converter and a coding unit,
wherein the sensor system further comprises at least one first switch being connected with the first resistor chain in such a manner that a central signal node is selectively coupleable with the first intermediate node, the second intermediate node, and the at least one first inner node,
wherein the sensor system further comprises at least one second switch being connected with the second resistor chain in such a manner that a central reference node is selectively coupleable with the first reference node, the second reference node, and the at least one second inner node,
wherein the central signal node and the central reference node are connected to an input side of the sigma delta converter, wherein the sigma delta converter is configured for providing the sensor output signal, and wherein the coding unit is configured for receiving the sensor output signal and for controlling the at least one first switch and the at least one second switch in response to the received sensor output signal.

14. The sensor system as set forth in claim 10, wherein the second signal path comprises a further intermediate node, wherein the second sensor path is designed such that the second reference node is in between the first subcomponent and the second subcomponent, the further intermediate node is in between the second subcomponent and the third subcomponent, and the first reference node is in between the third subcomponent and the fourth subcomponent, and wherein the processing unit further receives a further input signal from the further intermediate node and provides the sensor output signal further based on the further input signal.

* * * * *